US008630834B2

(12) United States Patent
Yu et al.

(10) Patent No.: US 8,630,834 B2
(45) Date of Patent: Jan. 14, 2014

(54) SIMULATING APPARATUS FOR SIMULATING INTEGRATED CIRCUIT

(75) Inventors: Meng-Che Yu, New Taipei (TW); Chi-Min Wang, New Taipei (TW)

(73) Assignee: Hon Hai Precision Industry Co., Ltd., New Taipei (TW)

( * ) Notice: Subject to any disclaimer, the term of this patent is extended or adjusted under 35 U.S.C. 154(b) by 190 days.

(21) Appl. No.: 13/249,265

(22) Filed: Sep. 30, 2011

(65) Prior Publication Data

US 2012/0296622 A1    Nov. 22, 2012

(30) Foreign Application Priority Data

May 20, 2011    (TW) .............................. 100117722 A

(51) Int. Cl.
*G06F 17/50*    (2006.01)
(52) U.S. Cl.
USPC .......................................................... 703/13
(58) Field of Classification Search
USPC ................. 703/14, 13; 324/612, 537, 754.03;
714/739, 726, 29; 374/43; 716/4;
165/264; 361/679.47
See application file for complete search history.

(56) References Cited

U.S. PATENT DOCUMENTS

| | | | |
|---|---|---|---|
| 5,404,492 A * | 4/1995 | Moraru et al. ................... 703/13 |
| 5,596,587 A * | 1/1997 | Douglas et al. ................ 714/739 |
| 5,656,942 A * | 8/1997 | Watts et al. ............... 324/750.19 |
| 5,729,431 A * | 3/1998 | Marwah et al. ........... 361/679.47 |
| 6,203,191 B1 * | 3/2001 | Mongan ........................... 374/43 |
| 6,331,770 B1 * | 12/2001 | Sugamori ................... 324/750.3 |
| 6,412,551 B1 * | 7/2002 | Tustaniwskyj et al. ........ 165/264 |
| 6,536,006 B1 * | 3/2003 | Sugamori ...................... 714/724 |
| 8,310,256 B2 * | 11/2012 | Suto .......................... 324/754.21 |
| 2004/0019827 A1 * | 1/2004 | Rohfleisch et al. ............. 714/29 |
| 2004/0068699 A1 * | 4/2004 | Morris et al. ...................... 716/4 |
| 2009/0079440 A1 * | 3/2009 | Williamson et al. .......... 324/612 |
| 2010/0079149 A1 * | 4/2010 | Takada et al. .................. 324/537 |
| 2011/0006794 A1 * | 1/2011 | Sellathamby et al. ... 324/754.03 |
| 2011/0099440 A1 * | 4/2011 | Mims et al. .................... 714/726 |
| 2011/0193581 A1 * | 8/2011 | Amaro et al. ............ 324/754.03 |

OTHER PUBLICATIONS

Lee, N.c., "A Hierarchical Analog Test Bus Framework for Testing Mixed-Signal Integrated Circuits and Printed Circuit Boards", Analog Integrated Circuits and Signal Processing, 1993.*

* cited by examiner

*Primary Examiner* — Kandasamy Thangavelu
(74) *Attorney, Agent, or Firm* — Altis Law Group, Inc.

(57) ABSTRACT

A device to simulate an integrated circuit (IC) includes a main body, a simulating signal generating module, and a converting module. The simulating signal generating module is positioned on the main body and generates signals indicative of signals of the IC. The converting module is positioned on the main body and converts the signals from digital to analog form. The connecting board is assembled to the main body and sends the converted signals to a printed circuit board (PCB).

9 Claims, 3 Drawing Sheets

SIMULATING APPARATUS FOR SIMULATING INTEGRATED CIRCUIT

BACKGROUND

1. Technical Field

The disclosure generally relates to simulating apparatuses, and particularly to a simulating apparatus used to simulate an integrated circuit (IC) which needs to be mounted to a printed circuit board (PCB).

2. Description of Related Art

During the manufacture of PCBs for electronic devices, such as computers, a control integrated circuit (IC), such as a power control IC, commonly needs to be assembled to the PCB in order to test performance of the PCB. However, not all versions of the control IC may be suitable for the layout of the PCBs and even constant IC design changes may be not be enough to immediately provide a suitable control IC. In addition, the PCB may be damaged by the repeated mounting and demounting of the control IC from the PCB.

Therefore, there is room for improvement within the art.

BRIEF DESCRIPTION OF THE DRAWINGS

Many aspects of the present disclosure can be better understood with reference to the following drawings. The components in the drawings are not necessarily drawn to scale, the emphasis instead being placed upon clearly illustrating the principles of the disclosure.

DETAILED DESCRIPTION

Figure 1:
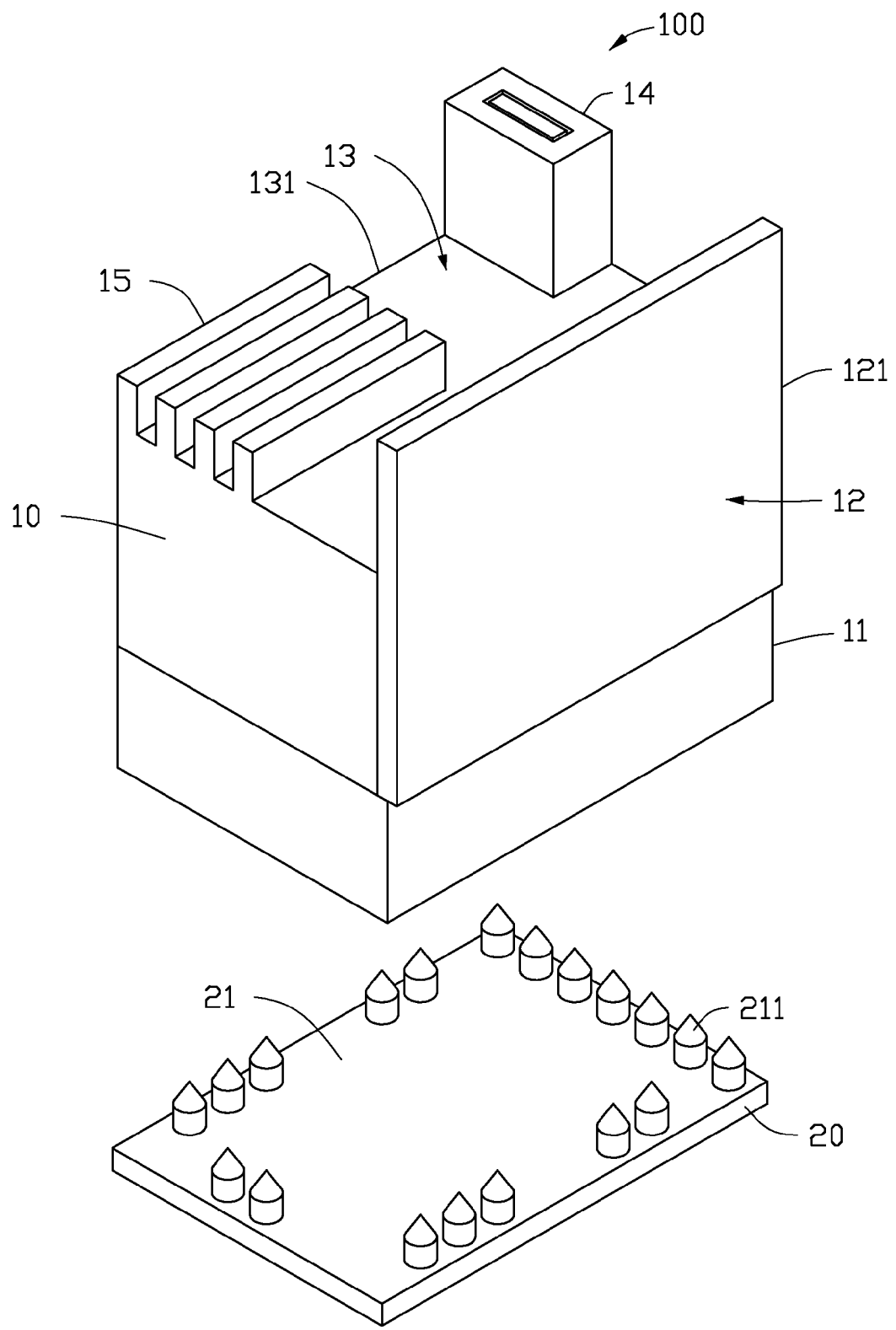
FIG. 1 is an isometric view of a simulating apparatus, according to an exemplary embodiment of the disclosure.

According to an exemplary embodiment of the disclosure, the simulating apparatus 100 of FIG. 1 includes a main body 10 and a connecting board 20. The simulating apparatus 100 can simulate an IC, such as a power control IC that can be attached to a PCB.

The main body 10 includes a base board 11, a simulating portion 12, and a converting portion 13.

Figure 2:
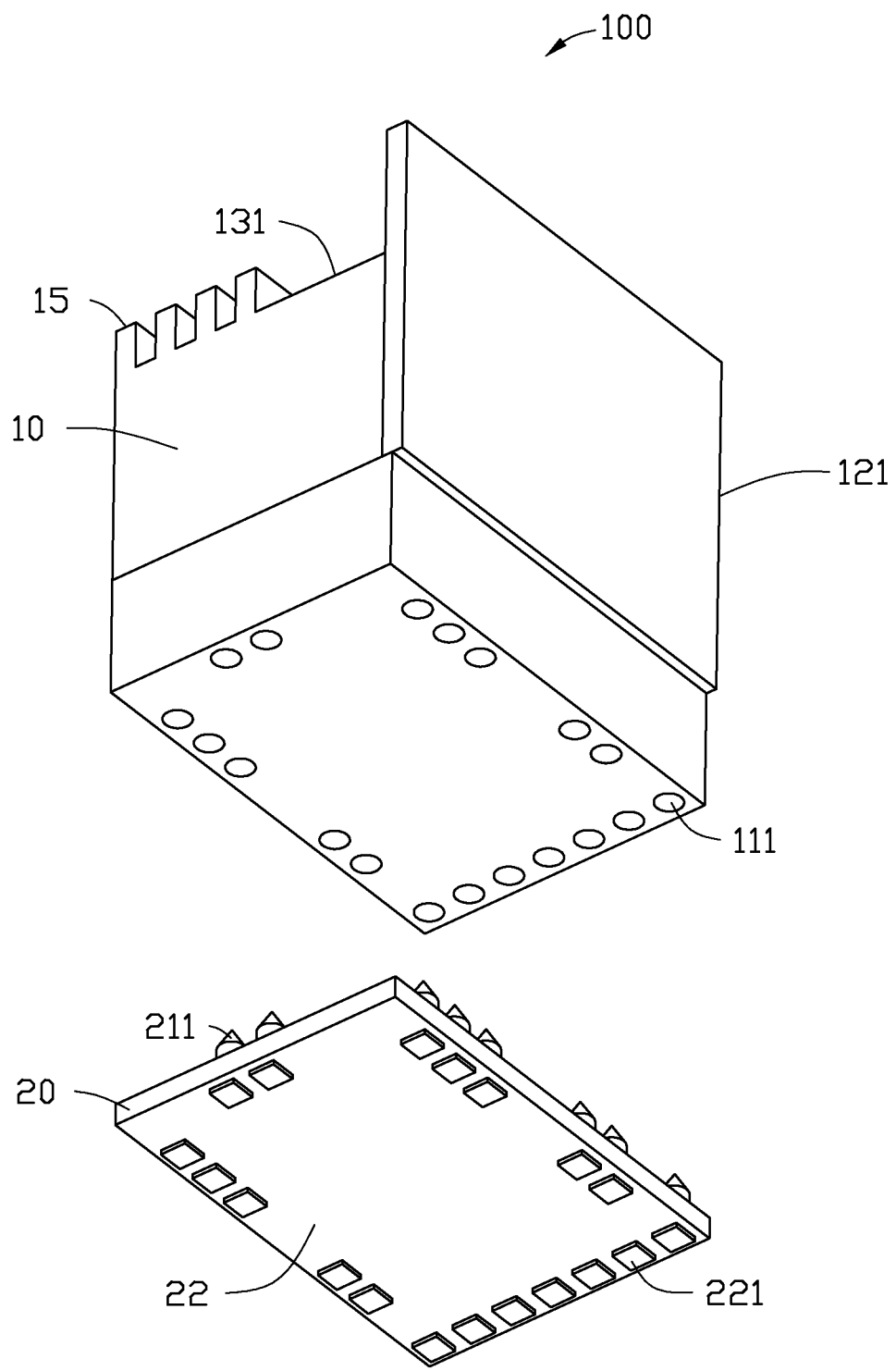
FIG. 2 is similar to FIG. 1, but showing the simulating apparatus from another aspect.

Referring to FIG. 2, the base board 11 is substantially rectangular. A plurality of receiving holes 111 are defined in one side of the base board 11 for assembling the connecting board 20 to the base board 11.

Figure 3:
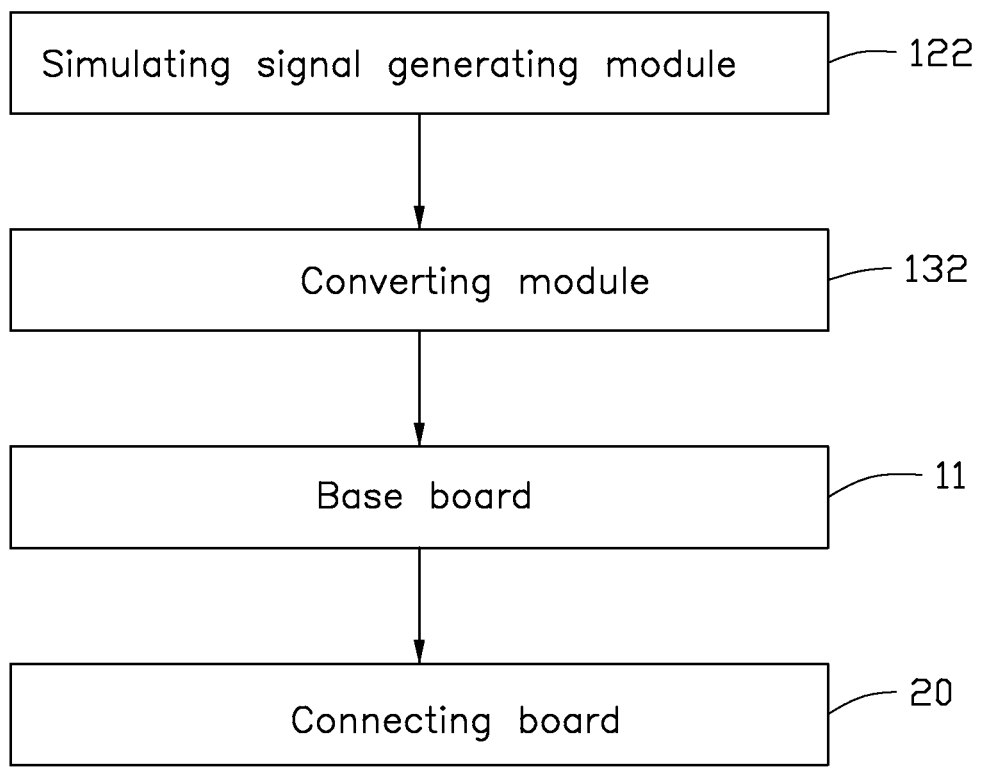
FIG. 3 is a block diagram of the simulating apparatus of FIG. 1, according to an exemplary embodiment of the disclosure.

Referring to FIG. 3, the simulating portion 12 includes a flat mounting board 121, and a simulating signal generating module 122. The mounting board 121 is mounted on one side of the base board 11. The simulating signal generating module 122 may be selected from the group consisting of a control IC, a drive IC, and two metallic oxide semiconductor field effect transistors (MOSFETs), which can simulate the functions of an IC. The simulating signal generating module 122 is arranged on the mounting board 121 and electrically connected to the converting portion 13. The simulating signal generating module 122 generates signals indicative of signals of the IC and transmits the signals to the converting portion 13. The signals may include driving signals, switch signals, and other signals.

The converting portion 13 includes a cuboid mounting block 131 and a converting module 132 positioned on the mounting block 131. The mounting block 131 is mounted on the base board 11 abutting the mounting board 121. The converting module 132 may be a converting circuit. The converting module 132 is electrically connected to the simulating signal generating module 122. The converting module 132 converts the signals from the simulating signal generating module 122 from digital to analog form and sends the converted signals to the corresponding receiving holes 111 of the base board 11.

The connecting board 20 includes a first surface 21 and a second surface 22 opposite to the first surface 21. A plurality of contact members 211 protrude up from the first surface 21 corresponding to the receiving holes 111. A plurality of conductive pads 221 are attached underneath the contact members 211 of the second surface 22, and each pad 221 corresponds to one of the contact members 211. The arrangement of the conductive pads 221 corresponds to the pins of the IC being simulated and the pads 221 can be electrically connected to the PCB. When the connecting board 20 is attached to the PCB, the converted signals are sent to the PCB from the conductive pads 221 of the connecting board 20. Thus, the simulating apparatus 100 can simulate an appropriate IC and is less damaging to the PCB.

In another embodiment, the main body 10 further includes a connector 14 and a plurality of heat sink fins 15. The connector 14 is mounted on the mounting block 131 and electrically connected to the converting module 132. The connector 14 is configured for connecting to a computer. Thus, users can control and monitor the simulating apparatus 100 by computer. The heat sink fins 15 are mounted on the mounting block 131 to disperse heat generated by the simulating apparatus 100.

It is believed that the exemplary embodiments and their advantages will be understood from the foregoing description, and it will be apparent that various changes may be made thereto without departing from the spirit and scope of the disclosure or sacrificing all of its material advantages, the examples hereinbefore described merely being preferred or exemplary embodiments of the disclosure.

What is claimed is:

1. A simulating apparatus used to simulate an integrated circuit (IC), comprising:
   a main body, comprising:
   a base board defining a plurality of receiving holes;
   a simulating portion, comprising a mounting board mounted on the base board and a simulating signal generating module positioned on the mounting board, the simulating signal generating module generating simulating signals indicative of signals of the IC; and
   a converting portion comprising a mounting block mounted on the base board; and
   a converting module positioned on the mounting block and electrically connected to the simulating signal generating module, the converting module converting the simulating signals from digital to analog form; and
   a connecting board assembled to the base board, and configured for sending the converted simulating signals to a printed circuit board (PCB), the connecting board comprising a plurality of contact members protruding from one surface of the connecting board and a plurality of conductive pads attached to opposite surface of the connecting board corresponding to the contact members, the contact members received in the receiving holes;
   wherein arrangement of the conductive pads corresponds to pins of the IC being simulated so that when the connecting board is attached to the PCB, the conductive pads send the converted simulating signals to the PCB.

2. The simulating apparatus of claim 1, wherein the simulating signal generating module is selected from the group consisting of a control IC, a drive IC and a metallic oxide semiconductor field effect transistor.

3. The simulating apparatus of claim 1, further comprising a connector positioned on the mounting block.

4. The simulating apparatus of claim 1, further comprising a plurality of heat sink fins positioned on the mounting block.

5. A simulating apparatus used to simulate an integrated circuit (IC), comprising:
a main body, comprising:
a simulating signal generating module positioned on the main body and generating simulating signals indicative of signals of the IC; and
a converting module positioned on the main body and converting the simulating signals from digital to analog form; and
a connecting board assembled to the main body and sending the converted simulating signals to a printed circuit board (PCB), the connecting board comprising a plurality of conductive pads attached to one surface of the connecting board;
wherein arrangement of the conductive pads corresponds to pins of the IC being simulated so that when the connecting board is attached to the PCB, the conductive pads send the converted simulating signals to the PCB.

6. The simulating apparatus of claim 5, wherein the main body defines a plurality of receiving holes, the connecting board comprises a plurality of contact members protruding from another surface of the connecting board opposite to the one surface having conductive pads attached, and received in the receiving holes.

7. The simulating apparatus of claim 5, wherein the simulating signal generating module is selected from one of the group consisting of a control IC, a drive IC, and a metallic oxide semiconductor field effect transistor.

8. The simulating apparatus of claim 5, further comprising a connector positioned on the main body.

9. The simulating apparatus of claim 5, further comprising a plurality of heat sink fins on the main body.

* * * * *